Figure 1:
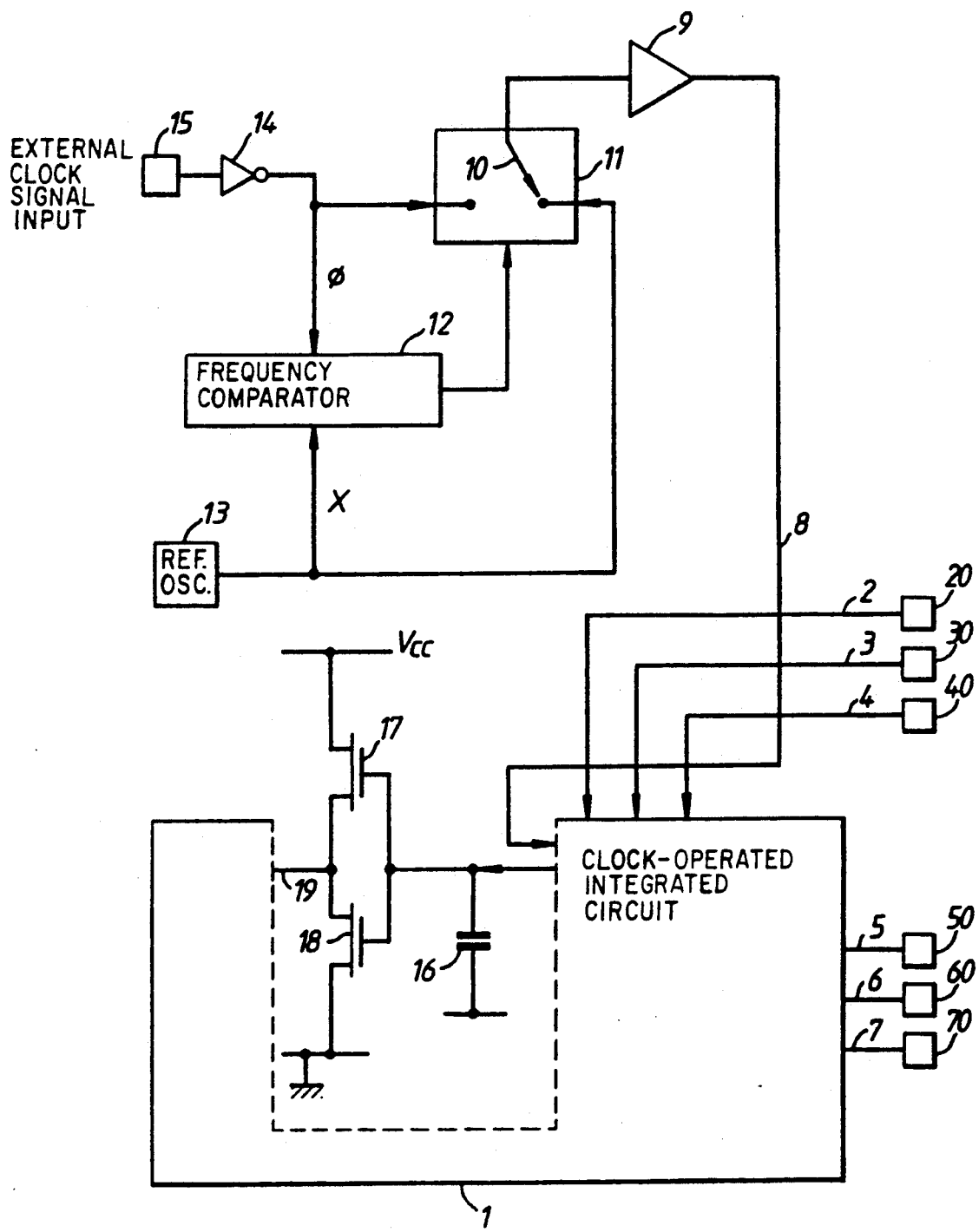

United States Patent [19]

Simpson

[11] Patent Number: 5,101,127

[45] Date of Patent: Mar. 31, 1992

[54] DIGITAL INTEGRATED FREQUENCY DISCRIMINATOR OF EXTERNAL CLOCK AND INTERNALLY GENERATED SIGNAL BACKUP

[75] Inventor: Richard Simpson, Houston, Tex.

[73] Assignee: Texas Instruments Incorporated, Dallas, Tex.

[21] Appl. No.: 649,204

[22] Filed: Jan. 25, 1991

Related U.S. Application Data

[63] Continuation of Ser. No. 327,646, Mar. 23, 1989, abandoned.

[51] Int. Cl.$^5$ .......................... H03K 9/06; H03K 5/22
[52] U.S. Cl. ..................................... 307/518; 307/526; 307/234; 328/109; 328/120; 328/134; 328/137; 331/49
[58] Field of Search .................. 328/61, 134, 137, 140, 328/154, 109, 120; 331/49; 307/479, 522, 523, 525–528, 518

[56] References Cited

U.S. PATENT DOCUMENTS

| | | | |
|---|---|---|---|
| 3,458,822 | 7/1969 | Hahn, Jr. | 328/120 |
| 3,708,686 | 1/1973 | Butler, Jr. et al. | 331/49 |
| 3,723,889 | 3/1973 | Oberst | 328/134 |
| 3,755,746 | 8/1973 | Hogue et al. | 328/134 |
| 4,128,811 | 12/1978 | Englund, Jr. | 328/134 |
| 4,308,472 | 12/1981 | McLaughlin | 307/518 |
| 4,374,361 | 2/1983 | Holden | 328/120 |
| 4,446,437 | 5/1984 | Rinaldi | 307/526 |
| 4,486,715 | 12/1984 | Maas et al. | 307/526 |
| 4,543,541 | 9/1985 | Norton | 331/49 |
| 4,816,776 | 3/1989 | Kessler | 331/49 |

Primary Examiner—Timothy P. Callahan
Attorney, Agent, or Firm—William E. Hiller; Richard L. Donaldson

[57] ABSTRACT

A digital integrated circuit normally operated from an external clock signal and including an internal reference oscillator for providing a reference signal as an internally generated signal backup in the event that the external clock signal is not present or is too low in frequency for safe operation of the integrated circuit. The integrated circuit has a frequency comparator for receiving the external clock signal and the internal reference signal as inputs and producing an output indicative of the state of the external clock signal. A two-way switch is connected to the output of the frequency comparator and selects either the external clock signal or the internal reference signal for transmission to the integrated circuit based upon the output from the frequency comparator. The frequency comparator includes a frequency discriminator which has two parts for providing respective complementary output logic signals when the external clock signal is consistently at either the high logic level or the low logic level, and for respectively providing the same output logic signal when the external clock signal alternates between the high and low logic levels. An output circuit is connected to the outputs of the first and second parts of the frequency discriminator for combining the output signals of the first and second parts in producing the output of the frequency comparator as provided to the two-way switch.

5 Claims, 2 Drawing Sheets

DIGITAL INTEGRATED FREQUENCY DISCRIMINATOR OF EXTERNAL CLOCK AND INTERNALLY GENERATED SIGNAL BACKUP

This application is a continuation of application Ser. No. 327,646, filed Mar. 23, 1989, now abandoned.

The present invention relates to a digital integrated circuit.

Large scale integrated circuits (LSIC's), and very large scale integrated circuits (VLSIC's) are complex digital circuits designed to execute binary logic operations. They include a substantial number of transistors arranged as switching networks, the transistors being intended to be so driven as to be switched rapidly between the alternative states of being switched on fully or switched off fully, and for most of the time to be either switched on fully or switched off fully. Many such circuits require an externally applied clock signal for correct operation. One of the functions of the clock signal is to provide an alternating voltage effective to switch transistors alternately on and off during the execution of binary logic operations by the circuit.

It is understood that a digital integrated circuit requiring an externally applied clock signal will not perform its intended function if the clock signal is not present but it has not, so far, been appreciated that other difficulties may arise from the absence of the required clock signal, for example, the absence of a clock signal may result in increased heating of components of the circuit, resulting in damage to the circuit in the absence of steps to prevent overheating.

The invention provides a digital integrated circuit that requires an externally applied clock signal for operation, which includes a network arranged to detect the presence of an externally applied clock signal and, in the absence of the externally applied clock signal, to provide an internally generated signal for maintaining safe operating conditions in the circuit.

Safe operating conditions in a circuit with current flow and subject to the heating effects of the currents flowing in the circuit include all conditions under which heating of the circuit by its currents is restricted to a level unlikely to cause damage to any circuit component.

Although a digital integrated circuit in accordance with the invention will not operate properly unless a clock signal is applied to it, it is protected against the damage that, in a known digital integrated circuit, might result from the mere absence of such an applied signal, and more so when steps are taken to ensure that at any time that a part of the circuit is energised and that part of the circuit requires an externally applied clock signal, that the internally generated signal is available for application to that part of the circuit.

A digital integrated circuit in accordance with the invention will be protected from damage, in the event of the absence of an external clock signal, by ensuring that the network for detecting the externally applied clock signal and providing the internally generated signal is energised when any part of the digital integrated circuit that requires an externally applied clock signal is energised, and by ensuring that the internally generated signal is applied to every part of the integrated circuit that requires an externally applied clock signal and is energised.

In one form of the invention, the internally generated signal is provided by an internal reference oscillator and is such as to effect the periodic switching on and switching off of components of the integrated circuit in order to maintain safe operating conditions in the circuit.

The periodic switching on and switching off of components, such as transistors, to maintain safe conditions in a circuit, is particularly suitable for circuits with capacitive elements that influence the conductive states of some of the transistors in the circuit, since the capacitive elements then alternate between their respective fully charged and their fully discharged states and the transistors that they influence are alternately switched on fully and switched off fully. In some circuit arrangements, such as a CMOS inverter stage, two transistors connected in series with each other are controlled by a single capacitive element, one transistor only is conductive when the capacitive element is fully charged, the other transistor alone is conductive when the capacitive element is fully discharged, and simultaneous conduction of the two transistors occurs for very brief periods during the change-over of the conductive states of the two transistors. The simultaneous conduction of the two transistors is a virtual short-circuit condition in the circuit which would be damaging if sustained for long periods, which may accompany conditions allowing the capacitive element to remain in a state other than the fully charged or fully discharged state for any significant length of time. The periodic switching on and switching off of the transistors, in the maintenance of safe conditions in a circuit, ensures that short-circuit conditions such as those possible with CMOS inverter stages, do not occur for periods likely to cause circuit damage.

The presence of capacitive elements which influence the states of transistors, particularly CMOS inverter stage transistors, influence the selection of the internal reference oscillator frequency in that it should not be low enough for the capacitive elements to discharge to the extent that both transistors of a CMOS inverter stage could be conductive between the internal reference oscillator transitions. A suitable lower frequency for the internal reference oscillator is one in the range 1 to 10 Hz, both limits included, and the preferred lower limit is 10 Hz. The capacitive elements do not influence the upper frequency limit of the internal reference oscillator, this being dependent on the possible external clock oscillator frequencies. Consideration of possible external clock oscillator frequencies reveals that 500 kHz would be a suitable upper frequency limit for the internal reference oscillator and that 100 kHz would be a preferred upper frequency, the points being taken into consideration being that the lowest external clock oscillator frequency is likely to be 1 MHz and that the internal reference oscillators may be expected to drift in frequency with time and operating temperature.

In the preferred arrangement, the internally generated signal from the internal reference oscillator is used in the detection of the presence of an externally applied clock signal, a desirable feature being that the functions of detecting the externally applied clock signal and of maintaining safe operating conditions in the circuit in the absence of an external clock signal are both performed by the internally generated signal.

In the arrangement in which the internally generated signal is used in the detection of an externally applied clock signal, the internal reference oscillator operates to provide a reference signal for a frequency discriminator which, in operation, detects the presence of an externally applied clock signal.

In the arrangement employing a frequency discriminator, the frequency discriminator operates to signal the detection of an externally applied clock signal only when an externally applied clock signal is present and the frequency of the externally applied clock signal is higher than that of the internal reference oscillator. This arrangement provides protection not only in the instances where there is no signal present at the port for receiving the external clock signal but also, in instances where there is a signal which is too low in frequency for safe operation.

In the preferred arrangement, the frequency discriminator operates to control a switch arrangement which, in operation, receives an externally applied clock signal and the internally generated signal from the internal reference oscillator and selects either the externally applied clock signal or the internally generated signal, according to the frequency discriminator signal, for internal use. This arrangement permits the use of the internally generated signal for the functions of detecting an externally applied clock signal and of maintaining safe conditions without an external clock.

The invention is especially useful when the integrated circuit includes complementary metal oxide semiconductor (CMOS) logic networks, since such networks include series-connected complementary transistors which are especially susceptible to damage if conditions within the circuit permit simultaneous conduction of both transistors. The maintenance of safe conditions in an integrated circuit which includes CMOS logic networks requires the maintenance conditions which do not permit the simultaneous conduction of series-connected transistors.

The frequency discriminator disclosed for the detection of an externally applied clock signal operates to detect when an externally applied clock signal provides alternately high and low logic levels and then to provide a first logic state output, and to detect when an externally applied clock signal is consistently at the high logic level or the low logic level, and then to provide a logic state output opposite to the first state.

Preferably, the frequency discriminator includes respective first and second arms for providing respective complementary output logic signals when an externally applied clock signal is consistently at the low logic level or consistently at the high logic level, and for each providing the same output logic signal when the externally applied clock signal alternates between the high and low logic levels, and an output circuit arranged to combine the output signals of the first and second arms.

Figure 2:
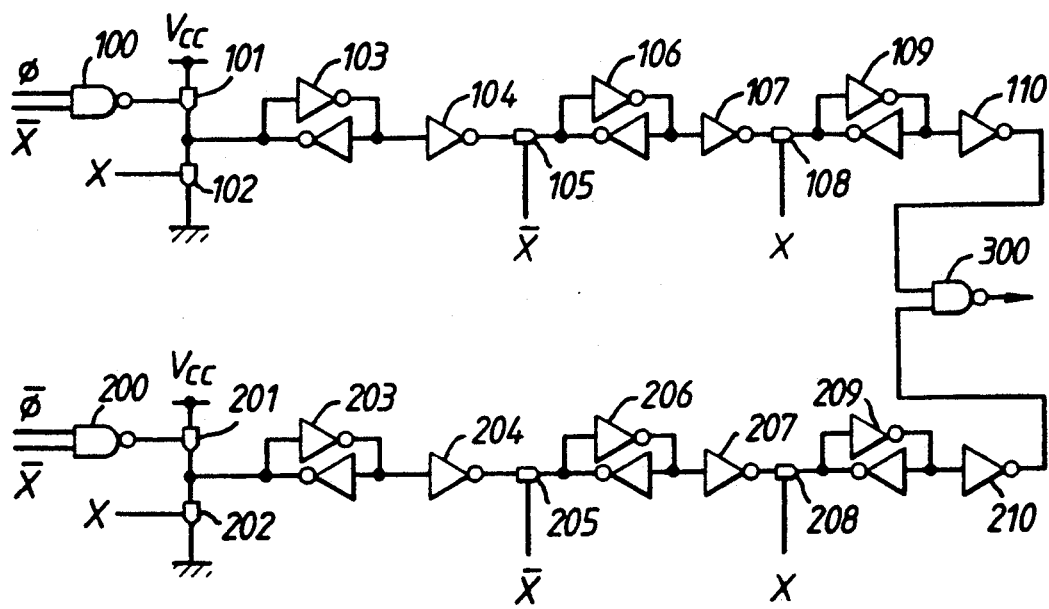

A digital integrated circuit in accordance with the present invention, and a frequency discriminator according to a further aspect of the invention, will now be described, by way of example only, with reference to the accompanying drawings in which:

FIG. 1 is a block diagram representation of a digital integrated circuit showing, in detail, the parts of the circuit material to the understanding of the invention; and FIG. 2 is a logic diagram representation of a frequency comparator used to provide an indication of the absence or the presence of an external clock signal in the digital integrated circuit represented by FIG. 1.

Referring now to FIG. 1 of the accompanying drawings, the parts of the integrated circuit not material to the understanding of the invention are represented by a block 1 provided with ports 20, 30, 40, 50, 60 and 70 and connections 2, 3, 4, 5, 6, and 7 between the ports and the integrated circuit. The integrated circuit includes also an input port 15 for receiving an external clock signal, an inverting buffer stage 14, an internal reference oscillator 13, a frequency comparator 12, a switching arrangement 11, a buffer amplifier 9, and a CMOS inverter stage comprising a capacitor 16 connected to MOS transistors 17 and 18.

In the integrated circuit represented by FIG. 1, the external clock oscillator input port 1 is connected to a first input port of the frequency comparator 12, the internal reference oscillator 13 is connected to a second input port of the frequency comparator 12, and the output port of the frequency comparator 12 is connected to the control port of the switching arrangement 11. The external clock oscillator input port 15 and the internal reference oscillator 13 are connected also to respective first and second signal input ports of the switching arrangement 11, and the signal output port of the switching arrangement 11 is connected to the remainder of the integrated circuit (represented by the block 1) by way of the buffer amplifier 9. The capacitor 16, which provides the voltage controlling the states of the inverter transistors 17 and 18, is connected to an internal signal line of the integrated circuit. The upper transistor 17 of the inverter is a PMOS transistor and the lower transistor 18 of the inverter is an NMOS transistor. The transistors 17 and 18 are connected in series across the circuit supply voltage which provides $V_{cc}$ volts.

In the operation of the integrated circuit represented in FIG. 1, the states of the inverter transistors 17 and 18 are so controlled that, for most of the time, either the transistor 17 alone is conductive or the transistor 18 alone is conductive, this being effected by means of the signal applied to the capacitor 16. Both the transistors 17 and 18 are conductive during each, very brief, transition between the conductive and non-conductive states. The signal applied to the capacitor 16 may be an alternating voltage which alternates between $V_{cc}$ volts and zero, the transistor 18 alone being switched on when the capacitor voltage is $V_{cc}$ volts and the transistor 17 alone being switched on when the capacitor voltage is zero. Alternatively, the signal applied to the capacitor 16 may be a voltage which has a level $V_{cc}$ volts for short lengths of time separated by long intervals of time, the capacitor 16 being disconnected from the signal source except for the periods when a voltage of $V_{cc}$ volts is being supplied. The signal voltage applied for short lengths of time may be zero, rather than $V_{cc}$ volts, and again the signal source is disconnected from the capacitor 16 at all other times. The signal applied to the capacitor 16 is derived from the clock signal, when this is present, supplied to the block 1 of the integrated circuit by way of the switch arrangement 11 and the buffer amplifier 9. When an external clock signal is present at the input port 15, the frequency comparator 12 effects connection of the switch arrangement 11 to the input port 15 and the external clock signal is supplied to the block 1 of the integrated circuit for use in controlling the timing of the signal to the capacitor 16. When no external clock signal is present at the input port 15, the frequency comparator 12 effects the connection of the switch arrangement 11 to the internal reference oscillator 13 and the internal reference oscillator signal is supplied to the block 1 of the integrated circuit, for the generation of the driving signal for the capacitor 16. The signal provided for the capacitor 16 when the internal reference oscillator signal is in use by the block 1 is effective so to operate the transistors 17 and 18 that one only of the two transistors is switched on at any time except at each transition between the transistor 17 being switched on and the transistor 18 being switched on, and vice versa. When there is an external clock signal present at the input port 15, but its frequency is below that of the internal reference oscillator signal, the frequency comparator 12 will effect connection of the switch arrangement 11 to the internal reference oscillator 13 rather than to the input port 15.

Referring now to FIG. 1, the internal reference oscillator 13 is a low frequency ring oscillator which is activated when the integrated circuit is so connected to a voltage supply as to cause energisation of any part of the integrated circuit. The frequency comparator 12 compares the internal reference oscillator signal with any signal that may be present at the input port 15. If there is no signal present at the input port 15, the switch element 10 of the switch arrangement 11 is set, by the control signal from the frequency comparator 12, to the right (as seen in FIG. 1) to make contact with the output line of the internal reference oscillator 13 which then provides a clocking signal for the integrated circuit. The switch element 10 of the switch arrangement 11 is also notionally positioned to the right when although there is a signal present at the input port 15 that signal is of lower frequency than the internal reference oscillator signal. The switch element 10 of the switch arrangement 11 is notionally positioned to the left when there is a signal present at the input port 15 and its frequency is higher than that of the internal reference oscillator 13. Whenever a signal of frequency higher than that of the internal reference oscillator 13 is present, or appears, at the input port 15, the frequency comparator 12 will effect connection of the switch arrangement 11 to the input port 15 rather than to the internal reference oscillator 13.

The arrangement represented by FIG. 1 ensures that the voltage of the capacitor 16 is always at a recognised logic level, that is, a level at which only one of the transistors 17 and 18 is switched on, except during the brief periods when the transistors are reversing their respective states, which is the intended condition.

In known digital integrated circuits in which an internal reference oscillator is not included, when no clock input signal is provided to the integrated circuit, the capacitor 16 may acquire a charge giving rise to a voltage between the two logic levels resulting in the switching on of both the transistors 17 and 18. The transistors 17 and 18, when both switched on, will represent a short-circuit across the supply voltage and will be damaged or destroyed. The situation of the transistors 17 and 18 being switched on at the same time may arise also where the correct clock signal has been present at the input port 15, the presence of which signal will cause the transistor 18 to be switched on and the transistor 17 to be switched off, and the capacitor 16 to be fully charged, and, subsequently, the clock signal at the input port 15 disappears, in which case, the capacitor may lose enough charge to permit the switching-on of the upper transistor 17 in addition to the lower transistor 18.

Referring to FIG. 1, the single insulated gate inverter stage comprising the complementary transistors 17 and 18 and the capacitor 16 is representative of many of the operating stages which are to be found in a large scale, or very large scale, integrated circuit, for example, a large scale, or very large scale, complementary metal oxide semiconductor circuit. The presence of a large number of inverters and other stages employing series-connected transistors, in an integrated circuit, makes it likely that at least one stage will suffer damage should both transistors be switched on at the same time, but it will be evident that the chances of such a damaging condition arising are at least substantially reduced, in relation to known integrated circuits, by the inclusion of the internal reference oscillator 13 as a clock signal source. Alternatively, the provision of the reference oscillator 13 is effective for safe operation even if the simultaneous conduction of the inverter stage transistors does not lead to damage to the inverter stage transistors, but the total current increase through the integrated circuit might lead to damage by reason of the overheating of the integrated circuit chip.

Referring to FIG. 2, the frequency comparator consists of identical first and second arms connected to respective input ports of a two-input NAND gate 300 which produces the output signal from the frequency comparator. The first arm of the frequency comparator includes a two-input NAND gate 100, switches 101, 102, 105, and 108, inverter stages 104, 107, and 110, and three inverting latches 103, 106, and 109 each of which consists of two inverters in parallel and facing in opposite senses. The second arm of the frequency comparator includes a two-input NAND gate 200, switches 201, 202, 205, and 208, inverter stages 204, 207 and 210, and three inverting latches 203, 206, and 209, as in the first arm.

Referring to FIG. 2, the output port of the NAND gate 100 is connected to the control port of the switch 101 which is connected in series with the switch 102 across the supply voltage, which provides $V_{cc}$ volts, the switch 101 occupying the upper position, and the switch 102 occupying the lower position, of the series arrangement. The inverting latch 103, the inverter stage 104, the switch 105, the inverting latch 106, the inverter stage 107, the switch 108, the inverting latch 109, and the inverter stage 110, are connected, in the order listed, in series, between the junction of the switches 101 and 102 and the upper input port of the NAND gate 300. Similarly, in the second arm of the frequency discriminator, the switches 201 and 202 occupy respective upper and lower positions, in series, across the voltage supply of $V_{cc}$ volts, the control port of the upper switch 201 is connected to the output port of the NAND gate 200, and the inverting latch 203, the inverter stage 204, the switch 205, the inverting latch 206, the inverter stage 207, the switch 208, the inverting latch 209, and the inverter stage 210, are connected in series, in the order listed, between the junction of the switches 201 and 202 and the other input port of the NAND gate 300. The NAND gate 100 receives input signals $\phi$ and $\overline{X}$, respectively, from the external clock oscillator and the internal reference oscillator complemented, the switch 102 receives a control input signal X from the internal reference oscillator, the switch 105 receives a control input signal $\overline{X}$ from the internal reference oscillator complemented, and the switch 108 receives a control input signal X from the internal reference oscillator. Additionally, in the second arm of the frequency comparator, the NAND gate 200 receives input signals $\overline{\phi}$ and $\overline{X}$, the switches 202 and 208 receive control input signals X, and the switch 205 receives a control input signal $\overline{X}$, $\phi$ being the external clock oscillator signal complemented.

In the operation of the frequency comparator represented by FIG. 2, the first arm indicates when the external clock oscillator signal $\phi$ remains at a low level. Referring to the first arm of the frequency comparator, during the time when the internal reference oscillator signal X is at its high level, the switch 102 is switched on, presenting a logic 0 at the input port of the inverting latch 103 and causing it to provide a logic 1 output, resulting in a logic 0 output from the inverter stage 104. During the time when the internal reference oscillator signal X is at its low level, represented by $\overline{X}$, the switch 102 is switched off and the logic 0 output from the combination of the latch 103 and the inverter stage 104 is transferred through the switch 105 to the combination of the latch 106 and the inverter stage 107. At the same time, the presence of the signal $\overline{X}$ at one input port of the NAND gate 100 permits the NAND gate 100 to respond to the level of the external clock signal $\phi$. If the external clock signal $\phi$ remains at the low level, the switch 101 remains switched off and the signal transferred to, and held by, the combination of latch 106 and the inverter stage 107 remains at logic 0. If the external clock signal $\phi$ goes to its high level during the time when the signal X is at its high level, the switch 101 is switched on and a logic 1 is passed through to the combination of the latch 106 and the inverter stage 107. When the internal reference oscillator signal X is again at its high level, the switch 108 is switched on and the logic level stored by the latch 106 is inverted by the inverter stage 107 and passed to the latch 109. The logic level stored in the latch 109 is supplied to the inverter stage 110. In the situation where the signal $\phi$ is at a logic 0 throughout the time when the signal X is at its high level, the inverter 110 provides a logic 0, and, where the signal is at a logic 1 at any time when the signal X is at its high level, the inverter stage 110 provides a logic 1.

Considering the second arm of the frequency comparator represented by FIG. 2, a logic 0 is developed and held by the combination of the latch 203 and the inverter stage 204 during the time when the signal X is at its high level. The logic 0 is transferred to the combination of the latch 206 and the inverter stage 207 during the time when the signal X is at its high level if the external clock signal $\phi$ remains at logic 1 during the time that the signal X is at its high level, and the logic 0 is transferred to the combination of the latch 209 and the inverter 210 during the time when the signal X is next at its high level. If, however, the external clock oscillator signal $\phi$ goes to its logic 0 level at any time during the time that the signal X is at its high level, then $\phi$ acting with the signal $\overline{X}$ on the NAND gate 200 cause a logic 1 to be present at the output of the inverter stage 210.

Considering both the first and the second arms of the frequency discriminator represented by FIG. 2, the first and the second arms both provide logic 1 inputs to the NAND gate 300 when the external clock signal $\phi$ has been at both its high and its low levels during the time that the signal X is at its high level, and the NAND gate 300 provides a logic 0 output. In the situation where the external clock signal $\phi$ has always been at its high level during the time that the signal X is at its high level, the first arm of the frequency discriminator provides a logic 1 and the second arm provides a logic 0 to the NAND gate 300, resulting in a logic 1 output from the NAND gate 300. Additionally, where the external clock signal $\phi$ has always been at its low level during the time that the signal X is at its high level, the first arm of the frequency discriminator provides a logic 0 and the second arm provides a logic 1, resulting again in a logic 1 output from the NAND gate 300. The result is, therefore, that a logic 0 output from the NAND gate 300 means that an external clock signal of frequency higher than the internal reference oscillator signal is present, and a logic 1 output from the NAND gate 300 means that there is no external clock oscillator signal or that its frequency is below that of the internal reference oscillator.

The internal reference oscillator, in this case, is a ring oscillator arranged to operate at a low frequency. The operating frequency of the ring oscillator sets the lowest external clock frequency at which the integrated circuit is operable. The protective arrangement will not permit operation at a frequency lower than the reference frequency. The ring oscillator is a known integrated circuit oscillator. Also, the switch arrangement for selecting either the external clock signal or the internal reference signal is conventional. The frequency of the ring oscillator is such as to be high enough to prevent the voltage of floating control nodes of the integrated circuit from moving enough between the oscillator waveform transitions to cause unsafe control node levels.

The safety arrangement described is suitable for several forms of integrated circuit, including, for example dynamic logic circuits, that is, circuits employing charges stored on capacitors to represent logic levels and in which the external clock signal is used to refresh the charges on the capacitors at regular intervals.

Very large scale integrated circuits, in particular, are susceptible to overheating on the loss of the external clock oscillator signals because the active components are operating at higher current densities than circuits with lower integration densities.

What we claim is:

1. A digital integrated circuit comprising:
    integrated circuit means including an input port for receiving an external clock signal at a predetermined first frequency to enable the integrated circuit means to perform its intended function;
    reference signal generating means internal to said integrated circuit means for providing an internal reference signal at a predetermined second frequency lower than said first frequency;
    frequency comparator means respectively connected to said input port and to said reference signal generating means for detecting the presence of the external clock signal as applied to said input port only when the external clock signal is present and at a frequency higher than the predetermined second frequency of the internal reference signal provided by said reference signal generating means to produce an output signal indicative of the state of the external clock signal;
    said frequency comparator means including frequency discrimination means for detecting when the external clock signal provides alternate high and low logic levels and producing the output signal of said frequency comparator means with a first logic state in response thereto indicative of the presence of the external clock signal at a frequency higher than the predetermined second frequency of the internal reference signal and for detecting when the external clock signal is consistently at one of the high logic level and the low logic level and producing the output signal of said frequency comparator means with a second logic state in response thereto indicative of the presence of the external clock signal at a frequency below the predetermined second frequency of the internal reference signal or the absence of the external clock signal, the second logic state being opposite from the first logic state; and switching means connected to the output of said frequency comparator means and being alternatively connectable in response to the logic state of the output signal from said frequency comparator means to said input port for selecting the external clock signal or to said reference signal generating means for selecting the internal reference signal to be applied to said integrated circuit means;

said switching means being connected to said input port to select the external clock signal to enable the integrated circuit means to perform its intended function when the output signal of said frequency comparator means is at the first logic state; and said switching means being connected to said reference signal generating means to select the internal reference signal to enable the integrated circuit means to perform in a safe operating mode when the output signal of said frequency comparator means is at the second logic state.

2. A digital integrated circuit as set forth in claim 1, wherein said frequency discrimination means includes first and second parts for providing respective complementary output logic signals when the external clock signal is consistently at one of the high logic level and the low logic level, and for respectively providing the same output logic signal when the external clock signal alternates between the high and the low logic levels; and an output circuit connected to the outputs of said first and second parts of said frequency discrimination means for combining the output logic signals of the first and second parts to produce the output signal of said frequency comparator means.

3. A digital integrated circuit as set forth in claim 1, wherein said integrated circuit means includes complementary metal oxide semiconductor (CMOS) logic networks connected to the output of said switching means for receiving the selected one of the external clock signal and the internal reference signal therefrom.

4. A frequency discriminator having first and second parts, each of said first and second parts including dual input means for receiving an input signal and a reference control signal;

logic means connected to said dual input means for detecting when the input signal provides alternate high and low logic levels in relation to the reference control signal for producing an output signal with a first logic state in response thereto and to detect when the input signal is consistently at one of the high logic level and the low logic level in relation to the reference control signal and producing the output signal with a second logic state in response thereto which is opposite from the first logic state;

said logic means of said first and second parts providing respective complementary output logic signals when the input signal is consistently at one of the high logic level and the low logic level in relation to the reference control signal, and for respectively providing the same output logic signal when the input signal alternates between the high and the low logic levels in relation to the reference control signal; and an output circuit connected to the outputs of said logic means of said first and second parts for combining the output logic signals of the first and second parts to provide the output signal of the frequency discriminator with one of a first logic state or a second logic state indicative of the state of the input signal in relation to the reference control signal.

5. A frequency discriminator as set forth in claim 4, wherein the respective dual input means of each of said first and second parts includes an input NAND gate for receiving the input signal and the reference control signal, said reference control signal varying between a high level and a low level, and said logic means of each of said first and second parts comprising a first switch connected to the output of said input NAND gate and controlled thereby for generating a logic "1" signal, a second switch controlled by the reference control signal for generating a logic "0" signal, a first storage stage connected to said first and second switches for receiving the logic signals therefrom, a second storage stage connected in cascade with the first storage stage, a third switch controlled by the reference control signal interposed between said first and second storage stages, a third storage stage connected in cascade with the second storage stage, and a fourth switch controlled by the reference control signal connected between said second and third storage stages; and said output circuit connected to the outputs of said logic means of said first and second parts comprising an output NAND gate connected to the outputs of the respective third storage stages of said logic means of said first and second parts;

said input NAND gate of said first part producing a logic "1" signal output to close the first switch when the input signal is at a high level and the reference control signal is at a low level for generating a logic "1" signal, said input NAND gate of said second part producing a logic "1" signal output to close the first switch when the input signal is at a low level and the reference control signal is at a low level for generating a logic "1" signal, and said second and fourth switches of said logic means of said first and second parts being closed when the reference control signal is at a high level, and said third switch of said logic means of said first and second parts being closed when the reference control signal is at a low level.

* * * * *